US010732509B2

(12) United States Patent
Wang et al.

(10) Patent No.: US 10,732,509 B2
(45) Date of Patent: Aug. 4, 2020

(54) KNIFE EDGE SET OF MASK ALIGNER, LARGE-VIEW-FIELD MASK ALIGNER, AND EXPOSURE METHOD (71) Applicant: SHANGHAI MICRO ELECTRONICS EQUIPMENT (GROUP) CO., LTD., Shanghai (CN)

(72) Inventors: Bin Wang, Shanghai (CN); Xiaofeng Yang, Shanghai (CN); Hongfa Xia, Shanghai (CN)

(73) Assignee: SHANGHAI MICRO ELECTRONICS EQUIPMENT (GROUP) CO., LTD., Shanghai (CN)

( * ) Notice: Subject to any disclaimer, the term of this patent is extended or adjusted under 35 U.S.C. 154(b) by 0 days.

(21) Appl. No.: 16/306,399

(22) PCT Filed: May 27, 2017

(86) PCT No.: PCT/CN2017/086270
§ 371 (c)(1),
(2) Date: Nov. 30, 2018

(87) PCT Pub. No.: WO2017/206828
PCT Pub. Date: Dec. 7, 2017

(65) Prior Publication Data
US 2020/0041910 A1  Feb. 6, 2020

(30) Foreign Application Priority Data
May 31, 2016 (CN) .......................... 2016 1 0378442

(51) Int. Cl.
G03F 7/20 (2006.01)
(52) U.S. Cl.
CPC ...... G03F 7/70066 (2013.01); G03F 7/70725 (2013.01)

(58) Field of Classification Search
CPC .......................... G03F 7/7035; G03F 7/70066
See application file for complete search history.

(56) References Cited

U.S. PATENT DOCUMENTS 4,780,747 A * 10/1988 Suzuki ............... G03F 7/70558
355/30
4,864,360 A * 9/1989 Isohata ............... G03F 7/70066
355/53

(Continued)

FOREIGN PATENT DOCUMENTS

CN   1419266 A    5/2003
CN  102650831 A   8/2012

(Continued)

Primary Examiner — Steven Whitesell Gordon
(74) Attorney, Agent, or Firm — Muncy, Geissler, Olds & Lowe, P.C.

(57) ABSTRACT

A shutter blade assembly for a photolithography machine, a large-field of view (FoV) photolithography machine and an exposure method are disclosed. A scanning-directional shutter blade subassembly is moved once during each illuminance test and then moved above alignment marks after the test. During exposure, the scanning-directional shutter blade subassembly moves with a mask stage in the same direction and at the same speed so that it stays stationary relative to the alignment marks on a photomask (4). In case of full-FoV exposure, it is not necessary for a non-scanning-directional shutter blade subassembly to be moved, while in case of partial-FoV exposure, it is moved into the partial exposure FoV and defines there a window for obtaining a light spot with a desired shape by modulating illumination light. After that, with the non-scanning-directional shutter blade subassembly being maintained stationary, the exposure FoV can be shifted from the current exposed region to a new region to be exposed simply by moving the mask and wafer stages. This process can be repeated until all the regions to be exposed have been exposed. Since the need for multiple (Continued)

shutter blade assemblies is dispensed with, structural simplification can be achieved, the requirements for control accuracy can be lowered.

23 Claims, 6 Drawing Sheets

(56) References Cited

U.S. PATENT DOCUMENTS

| | | | | |
|---|---|---|---|---|
| 5,161,176 A | * | 11/1992 | Ebinuma | G03F 7/70066 |
| | | | | 359/232 |
| 5,317,615 A | * | 5/1994 | Ebinuma | G03F 7/70066 |
| | | | | 378/207 |
| 5,390,227 A | * | 2/1995 | Mizusawa | G03F 7/70066 |
| | | | | 378/150 |
| 5,506,684 A | * | 4/1996 | Ota | G01B 11/26 |
| | | | | 250/548 |
| 5,760,881 A | * | 6/1998 | Miyazaki | G03F 7/70066 |
| | | | | 355/71 |
| 5,780,861 A | * | 7/1998 | Apelgren | G03F 1/64 |
| | | | | 250/492.1 |
| 5,793,472 A | * | 8/1998 | Hori | G03F 7/20 |
| | | | | 355/53 |
| 6,288,772 B1 | * | 9/2001 | Shinozaki | G03F 7/70066 |
| | | | | 355/53 |
| 6,295,119 B1 | * | 9/2001 | Suzuki | G03B 27/32 |
| | | | | 355/53 |
| 6,411,364 B1 | * | 6/2002 | Suzuki | G03F 7/70066 |
| | | | | 250/216 |
| 2002/0051915 A1 | * | 5/2002 | Karamatsu | G03F 7/70066 |
| | | | | 430/22 |
| 2004/0009431 A1 | * | 1/2004 | Amo | G03F 7/70066 |
| | | | | 430/311 |
| 2004/0211920 A1 | | 10/2004 | Maria Derksen et al. | |
| 2005/0157285 A1 | * | 7/2005 | Schothorst | G03F 7/70066 |
| | | | | 355/71 |
| 2009/0029270 A1 | * | 1/2009 | Otsuka | G03F 7/70066 |
| | | | | 430/5 |
| 2009/0148782 A1 | * | 6/2009 | Kono | G03F 7/70066 |
| | | | | 430/5 |
| 2012/0242967 A1 | * | 9/2012 | Voogd | G03F 7/70066 |
| | | | | 355/67 |

FOREIGN PATENT DOCUMENTS

| | | |
|---|---|---|
| CN | 103439865 A | 12/2013 |
| CN | 103931731 A | 7/2014 |
| JP | H07283124 A | 10/1995 |
| JP | H11260711 A | 9/1999 |
| JP | 2002036373 A | 2/2002 |
| JP | 2003324028 A | 11/2003 |

* cited by examiner

KNIFE EDGE SET OF MASK ALIGNER, LARGE-VIEW-FIELD MASK ALIGNER, AND EXPOSURE METHOD

TECHNICAL FIELD

The present invention relates to the field of semiconductor fabrication and, in particular, to a shutter blade assembly for a photolithography machine, a large-FoV (Field of View) photolithography machine and an exposure method.

BACKGROUND

Figure 1:
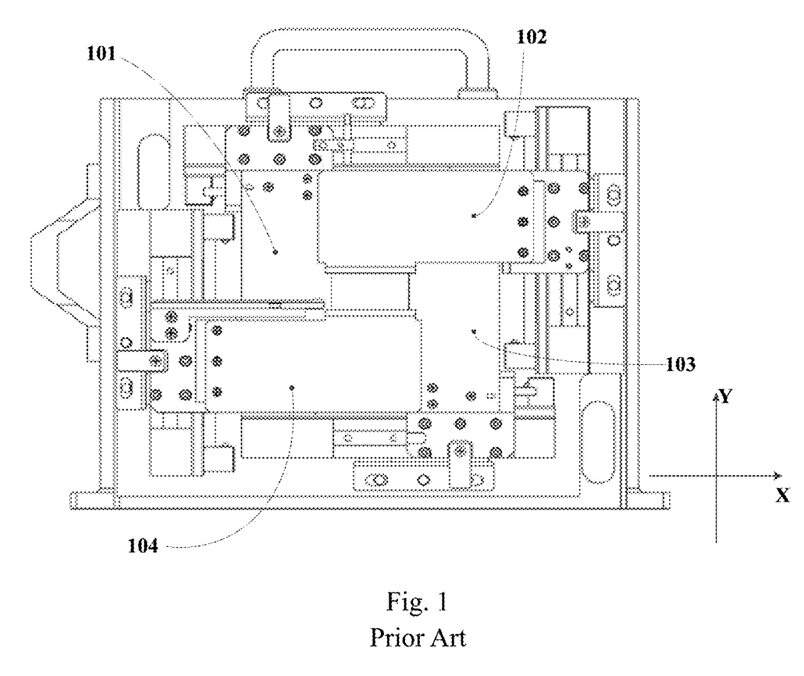
FIG. 1 is a structural schematic of a conventional movable shutter.

In the field of flat panel manufacturing, a photolithography machine for fabricating thin film transistors (TFTs) is the main equipment for projecting an image of a photomask pattern onto the surface of a substrate by means of an objective lens assembly. With the rapid development of the flat panel display industry, the size of substrates is continuously increasing. In order to increase the manufacturing yield, objective lens assemblies have evolved from the earlier ones with only one field of view (FoV) to the modern multi-FoV ones. For example, a Generation 6 (G6) objective lens assembly has six FoVs, i.e., consisting of six objective lenses. A movable shutter is a mechanism for static exposure by illumination, shading of mask marks, etc., and the conventional movable shutter is disposed under an illumination device. With a Generation 4.5 (G4.5) movable shutter as an example, as shown in FIG. 1, it consists of four shutter blades, i.e., a first Y-directional shutter blade 101, a first X-directional shutter blade 102, a second Y-directional shutter blade 103 and a second X-directional shutter blade 104. During normal exposure, a mask stage and a wafer stage move in the same direction and at the same speed, concurrently with the movable shutter moving in synchronization with the mask stage in order to shade marks on the photomask, in which the first and second X-directional shutter blades 102, 104 control an X-directional size of the FoV, and the first and second Y-directional shutter blades 101, 103 control a Y-directional size of the FoV. During static exposure, a slit defined by the first and second Y-directional shutter blades 101, 103 performs a scan in the Y direction. However, when used in the modern multi-FoV scheme, each of the FoV will need to be equipped with such a movable shutter, making the system bulky and complex in structure. Moreover, the multi-FoV scheme requires expansion both in shutter size and shutter stroke. For example, G6 systems employing six objective lenses requires an increase in shutter size from 40 mm for G4.5 system to 750 mm, as well as an increase in shutter stroke from 44 mm for G4.5 system to 1100 mm. Therefore, the conventional movable shutters cannot meet the requirements of modern systems.

Figure 2:
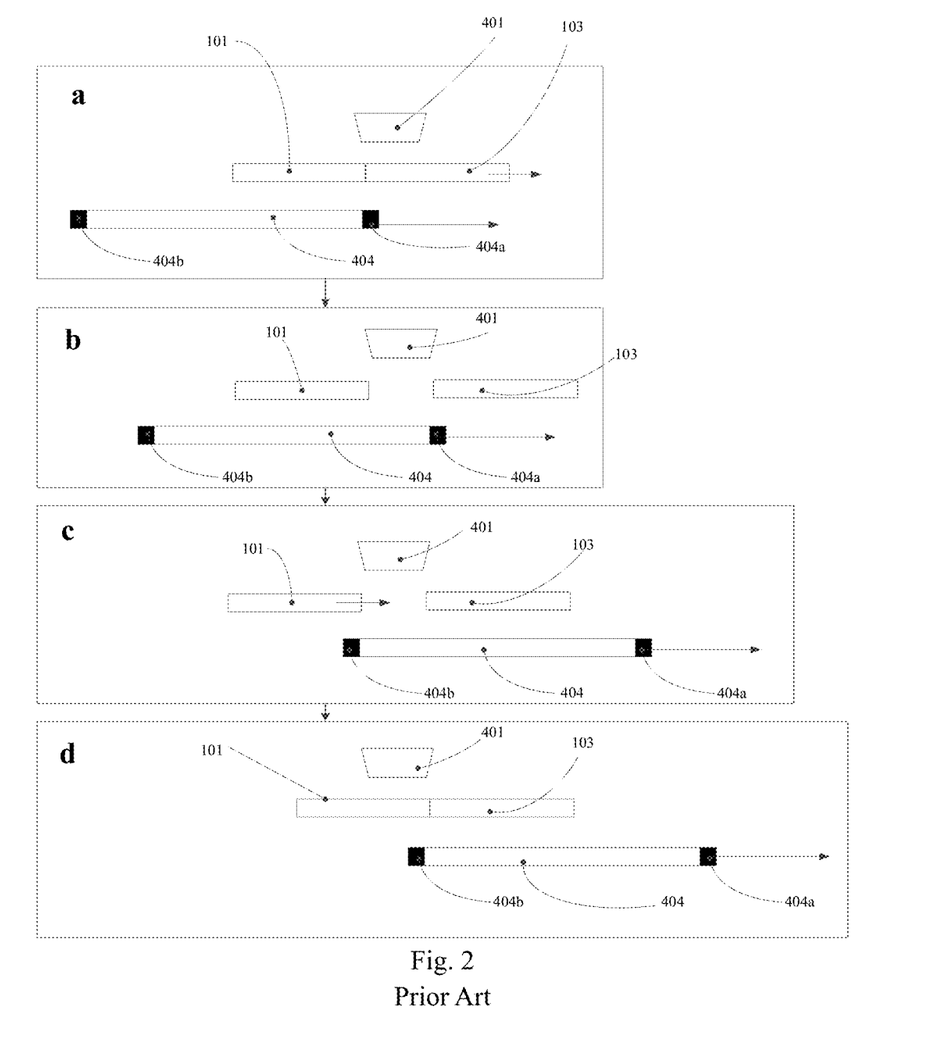
FIG. 2 is a flowchart graphically illustrating how Y-directional shutter blades in the conventional movable shutter move during normal exposure.
Figure 3:
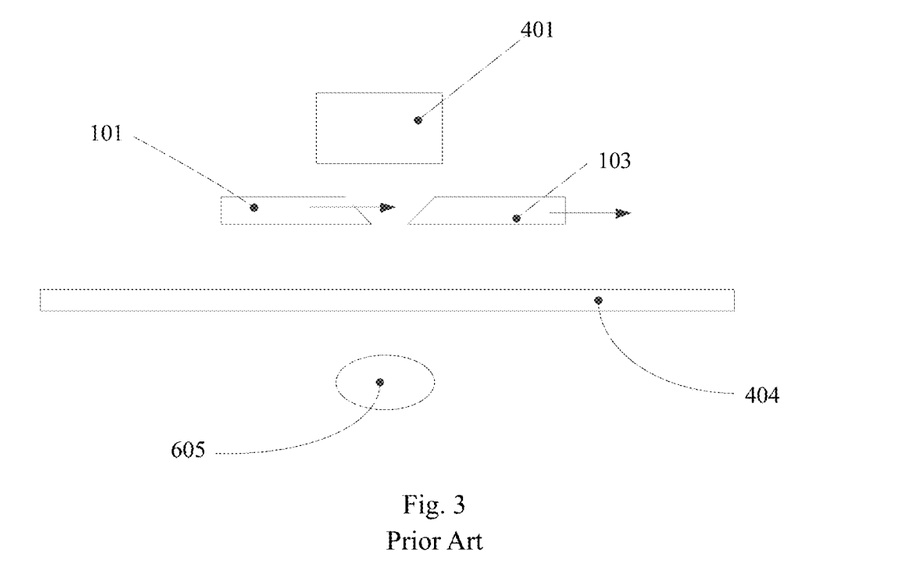
FIG. 3 is a diagram schematically illustrating how the Y-directional shutter blades in the conventional movable shutter move during static exposure.

Further, referring to FIGS. 2 and 3, for each FoV, the first and second Y-directional shutter blades 101, 103 are required to move in the Y direction during exposure strictly at speeds calculated based on the movement of the mask stage. During normal exposure, one major task for the movable shutter is to shade alignment marks so as to prevent printing the alignment marks on the wafer. Specifically, as shown in FIG. 2, in order to fulfill the mark shading task, a G4.5 movable shutter must be synchronized with a photomask 404 in the following four phases: upon a front mark 404a on the photomask 404 moving into alignment with an illumination device 401 thereabove (as shown in FIG. 2a), the second Y-directional shutter blade 103 moves in synchronization with the photomask 404 while shading the mark until a desired FoV width is achieved (as shown in FIG. 2b); and upon a rear mark 404b on the photomask 404 moving into alignment with the illumination device 401 thereabove (as shown in FIG. 2c), the first Y-directional shutter blade 101 moves in synchronization with the photomask 404 while shading the mark until it reaches a proximal edge of the FoV (as shown in FIG. 2d). During static exposure, one major task for the movable shutter is to work with the illumination device to control an exposure dose that depends essentially on illuminance, attenuation rate, scanning speed and slit width. During static exposure carried out by the G4.5 movable shutter, as shown in FIG. 3, when the photomask 404 moves into alignment with an area to be scan-exposed, the illumination device 401 is activated and the first and second Y-directional shutter blades 101, 103 that define a slit with a desired width move at the same speed for scanning. At the same time, a sensor 605 disposed under the photomask 404 receives light, that has passed through the slit and the mask stage, and obtains data about the exposure.

Therefore, the conventional movable shutters require blade speed control both in normal and static exposure. Moreover, blade speed changes, during which errors are apt to occur, are necessary upon switching between the normal exposure mode and the static exposure mode.

SUMMARY OF THE INVENTION

In order to solve the above problems, the present invention proposes a shutter blade assembly for a photolithography machine, a large-FoV photolithography machine and an exposure method.

To this end, the shutter blade assembly for a photolithography machine provided in the present invention is disposed within the photolithography machine, and an exposure performed by the photolithography machine, a mask stage and a wafer stage move in the same direction that is defined as a scanning direction, with a direction horizontally orthogonal to the scanning direction being defined as a non-scanning direction.

The shutter blade assembly includes:

a scanning-directional shutter blade subassembly movable in the scanning direction, the scanning-directional shutter blade subassembly being configured to shade alignment marks on a photomask carried by the mask stage; and a non-scanning-directional shutter blade subassembly movable in the non-scanning direction.

A light spot of an illumination light provided by an illumination device of the photolithography machine is used for the exposure after having been trimmed by a window defined by the non-scanning-directional shutter blade subassembly.

During the exposure, the scanning-directional shutter blade subassembly stays stationary relative to the alignment marks on the photomask, and the non-scanning-directional shutter blade subassembly stays stationary relative to the illumination device.

The present invention also provides a large-field of view (FoV) photolithography machine for exposing multiple regions to be exposed, including, disposed sequentially from the top downward:

an illumination device for providing an illumination light;

a mask stage for carrying a photomask; and a wafer stage for carrying a substrate to be scan-exposed, wherein during exposure, the wafer stage and the mask stage move in a same direction and at a same speed, the direction being defined as a scanning direction, with a direction horizontally orthogonal to the scanning direction being defined as a non-scanning direction, the large-FoV photolithography machine further includes:

a scanning-directional shutter blade subassembly movable in the scanning direction, the scanning-directional shutter blade subassembly being configured to shade alignment marks on the photomask; and a non-scanning-directional shutter blade subassembly movable in the non-scanning direction, A light spot of the illumination light provided by an illumination device of the photolithography machine is used for the exposure after having been trimmed by a window defined by the non-scanning-directional shutter blade subassembly.

The exposure of each of the multiple regions to be exposed is performed by keeping the scanning-directional shutter blade subassembly stationary relative to the alignment marks on the photomask and keeping the non-scanning-directional shutter blade subassembly stationary relative to the illumination device, wherein the exposure of the multiple regions to be exposed can be completed by driving the mask stage and the wafer stage to successively move the multiple regions to be exposed into an illumination FoV of the illumination device.

Preferably, the scanning-directional shutter blade subassembly may be disposed on a coarse-motion stage for the mask stage and is situated higher than the photomask, the scanning-directional shutter blade moving with the coarse-motion stage for the mask stage during the exposure.

Preferably, the scanning-directional shutter blade subassembly includes a front shutter blade and a rear shutter blade extending longitudinally parallel to each other.

Preferably, each of the front and rear shutter blades is a metal sheet extending longitudinally parallel to the non-scanning direction, and wherein the rear shutter blade has a slit extending longitudinally parallel to the non-scanning direction formed therein.

Preferably, a sensor is disposed under the mask stage and configured to sense the illumination light that has passed through the slit.

Preferably, the scanning-directional shutter blade subassembly further includes a first movement guide and a first driving member, the first movement guide extending longitudinally along the scanning direction, the first driving member being configured to drive the front and rear shutter blades to move along the first movement guide.

Preferably, two first movement guides that are parallel to each other are provided, and two ends of each of the front and read shutter blades are moveable along the two first movement guides.

Preferably, the first driving member includes linear motors disposed at the two ends of each of the front and read shutter blades.

Preferably, decoupling devices are arranged in connections between the two ends of each of the front and read shutter blades and the first movement guides.

Preferably, the decoupling devices are cross roller rings.

Preferably, blade locking devices are provided at connections between the two ends of each of the front and read shutter blades and the first movement guides.

Preferably, the blade locking devices are guide dampers configured to immobilize the front and read shutter blades on the first movement guides.

Preferably, the first movement guides are provided with respective orientation measuring devices.

Preferably, the orientation measuring devices are grating scales.

Preferably, the large-FAT photolithography machine further includes an objective lens assembly disposed between the mask stage and the substrate, the objective lens assembly including several objective lenses arranged in an array.

Preferably, the non-scanning-directional shutter blade subassembly is disposed between the objective lens assembly and the substrate.

Preferably, the non-scanning-directional shutter blade subassembly includes four shutter blades arranged in two rows and two columns.

Preferably, the shutter blades are rectangular.

Preferably, the non-scanning-directional shutter blade subassembly further includes a second movement guide and a second driving member, each extending longitudinally in the non-scanning direction, the second driving member being configured to drive the four shutter blades to move along the second movement guide so as to accomplish FoV adjustment.

Preferably, two second movement guides opposing each other are provided, with each of the second movement guides supporting two of the shutter blades, the two of the shutter blades being movable along a corresponding one of the two second movement guides.

Preferably, the second driving member includes a lead screw extending parallel to the second movement guide and a rotating motor that is coupled to the lead screw, each of the shutter blades of the non-scanning-directional shutter blade subassembly is driven by the rotating motor cooperating with the lead screw.

The present invention also provides an exposure method using the large-FoV photolithography machine as defined above, including the steps of:

1) prior to exposure, performing an illuminance test for a region to be exposed by moving a scanning-directional shutter blade subassembly over the region to be exposed in the scanning direction;

2) moving the non-scanning-directional shutter blade subassembly over the region to be exposed and defining, by the non-scanning-directional shutter blade subassembly, a window for trimming an illumination light;

3) moving the mask stage and the wafer stage in a same direction and moving the scanning-directional shutter blade subassembly with the mask stage so that the scanning-directional shutter blade subassembly is stationary relative to alignment marks on the photomask and the non-scanning-directional shutter blade subassembly is stationary relative to the illumination device, thereby exposing the region to be exposed; and 4) moving a new region to be exposed into an illumination FoV of the illumination device by moving the mask stage and the wafer stage and repeating step 1) to step 3) to expose the new region to be exposed.

Preferably, the photomask includes two alignment areas distributed in symmetry and several pattern areas arranged in an array, the two alignment areas distributed at respective ends of the photomask, each of the pattern areas corresponding to a region to be exposure.

Preferably, the scanning-directional shutter blade subassembly includes a front shutter blade and a rear shutter blade, and wherein during exposure, the front and rear shutter blades are positioned above the respective alignment areas to block the illumination light away from the alignment areas.

Preferably, in step 2), the illuminance test for the region to be exposed performed by moving the scanning-directional shutter blade subassembly over the region to be exposed in the scanning direction includes: fixing the front shutter blade above the alignment areas, while moving the rear shutter blade in the scanning direction and receiving, by a sensor disposed under the mask stage, the illumination light that has successively passed through a slit in the rear shutter blade and the mask stage; and deriving illuminance data for the region to be exposed from the received illumination light.

In the shutter blade assembly, the large-FoV photolithography machine and the exposure method provided in the present invention, the scanning-directional shutter blade subassembly is moved once during each illuminance test and moved above the alignment marks after the test. During exposure, the scanning-directional shutter blade subassembly moves with the mask stage in the same direction and at the same speed so that it stays stationary relative to the alignment marks on the photomask 4. In case of full-FoV exposure, it is not necessary for the non-scanning-directional shutter blade subassembly to be moved, while in case of partial-FoV exposure, it is moved into the partial exposure FoV and defines there a window for obtaining a light spot with a desired shape by modulating the illumination light. After that, with the non-scanning-directional shutter blade subassembly being maintained stationary, the exposure FoV can be shifted from the current exposed region to a new region to be exposed simply by moving the mask and wafer stages. This process can be repeated until all the regions to be exposed have been exposed.

Compared to the prior art, the present invention offers the following benefits:

1. It is simpler in structure because exposure tasks in applications with various exposure FoVs can be fulfilled with the same scanning-directional and non-scanning-directional shutter blade subassemblies simply by moving the mask and wafer stages.

2. During exposure, it is not necessary for the scanning-directional and non-scanning-directional shutter blade subassemblies to always move with the mask and wafer stages at various speeds. This can lower the requirements for control accuracy and reduce the probability of error.

In FIGS. 1 to 3: 401-illumination device; 404-photomask; 404a-front mark; 404b-rear mark; 101-first Y-directional shutter blade; 102-first X-directional shutter blade; 103-second Y-directional shutter blade; 104-second X-directional shutter blade; 605-sensor.

In FIGS. 4 to 9: 201-grating scale; 202-cross roller ring; 203-front shutter blade; 204-rear shutter blade; 2041-slit; 205-first movement guide; 206-linear motor; 207-coarse-motion stage; 208-guide damper; 301-first shutter blade; 302-second shutter blade; 303-third shutter blade; 304-fourth shutter blade; 305-rotating motor; 306-objective lens; 307-second movement guide; 308-lead screw; 4-photomask; 401-alignment area; 402-pattern area;

a-region to be exposed.

DETAILED DESCRIPTION

Particular embodiments of the present invention will be described in detail below with reference to the accompanying drawings so that the above objectives, features and advantages of the invention will become more apparent and readily understood.

Referring now to FIGS. 4 to 7, the present invention provides a shutter blade assembly for a photolithography machine. The shutter blade assembly is disposed within the photolithography machine, and during exposure performed by the photolithography machine, a mask stage and a wafer stage move in the same direction that is defined as a scanning direction, with a direction horizontally orthogonal to the scanning direction being defined as a non-scanning direction.

Figure 4:
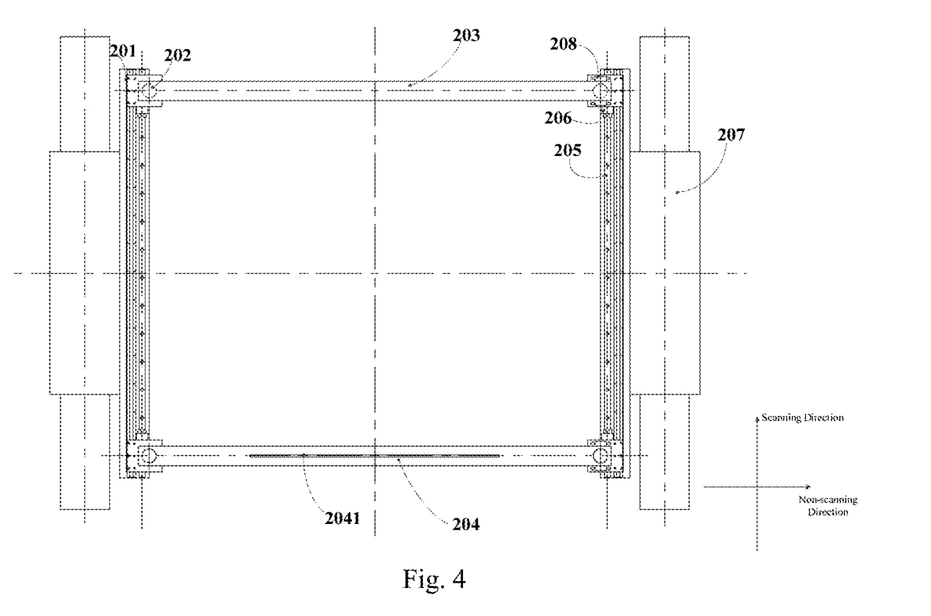
FIG. 4 is a structural schematic of a scanning-directional shutter blade subassembly during normal exposure according to the present invention.

The shutter blade assembly includes:

a scanning-directional shutter blade subassembly movable in the scanning direction, the scanning-directional shutter blade subassembly being configured essentially for shading alignment marks on a photomask carried on the mask stage so as to prevent the alignment marks from being printed on a substrate during the exposure, i.e., moving at the same speed and in the same direction as the mask stage during the exposure so as to stay stationary relative to the alignment marks, as shown in FIG. 4;

a non-scanning-directional shutter blade subassembly movable in the non-scanning direction, the non-scanning-directional shutter blade subassembly being configured essentially to, during partial-FoV exposure, define a window above a target region within a partial exposure FoV, through which light from an illumination device passes through and is thus modulated to form a desired light spot on the target region for its exposure.

After the exposure of the aforementioned target region, the non-scanning-directional shutter blade subassembly stays stationary, with the mask and wafer stages moving and the scanning-directional shutter blade subassembly moving with the mask stage, so that the next target region of the photomask 4 enters the partial exposure FoV and is exposed. This process is repeated so that all target regions can be exposed simply by moving the mask and wafer stages.

The present invention also provides a large-FoV photolithography machine using the above shutter blade assembly for exposure. The large-FoV photolithography machine including, from the top downward:

the illumination device (not shown) for providing the illumination light;

the mask stage (not shown) carrying the photomask 4 on its surface, the mask stage being provided with a coarse-motion stage 207 that surrounds the mask stage, the coarse-motion stage 207 enabling large-stroke movement of the mask stage;

an objective lens assembly, consisting of six objective lenses 306 in this embodiment, which are arranged into two parallel rows each containing three of the objective lenses 306, the three of the objective lenses 306 extending along the non-scanning direction; and the wafer stage (not shown), carrying, on its surface, a substrate (not shown) to be scan-exposed, the wafer stage being configured to move in the same direction and at the same speed as the mask stage, this direction being defined as a scanning direction, with a direction horizontally orthogonal to the scanning direction being defined as a non-scanning direction.

The large-FoV photolithography machine further includes:

the scanning-directional shutter blade subassembly, disposed on the coarse-motion stage 207 for the mask stage and located higher than the photomask 4 in order to shade the alignment marks on the photomask 4 so as to prevent the alignment marks from being irradiated by the illumination light and thus printed onto the substrate, the scanning-directional shutter blade subassembly being configured to move in the scanning direction; and the non-scanning-directional shutter blade subassembly disposed between the objective lens assembly and the substrate, the non-scanning-directional shutter blade subassembly being configured to move in the non-scanning direction.

Referring to FIG. 4, the scanning-directional shutter blade subassembly may be structured as follows. Two first movement guides 205 are disposed at respective edges of the coarse-motion stage 207 that are parallel to the scanning direction so that they extend longitudinally parallel to the respective edges and the length of the first movement guides 205 defines a stroke range for the scanning-directional shutter blade subassembly. Two shutter blades are supported by the two first movement guides 205, wherein the two shutter blades are comprised of a front shutter blade 203 and a rear shutter blade 204. The two shutter blades are elongated metal sheets extending longitudinally parallel to the non-scanning direction, and each of the two shutter blades is supported at its both ends by the respective first movement guides 205, so that they can move on the first movement guides 205 in the scanning direction. Each of the shutter blades is provided, at its both ends, with respective driving members implemented in this embodiment as linear motors 206. Preferably, the first movement guides 205 are supported on the linear motors 206 so that the linear motors 206 can drive the shutter blades to move along the first movement guides 205.

Preferably, referring to FIG. 4, each of the two shutter blades may be provided, at its both ends, with respective decoupling devices implemented as cross roller rings 202. These cross roller rings 202 are able to decouple the movement of the shutter blades in the non-scanning direction from impacts exerted along the perpendicular direction. Moreover, the two shutter blades may also be provided with blade locking devices, which are implemented in this embodiment as guide dampers 208 at connections between the ends of the shutter blades and the first movement guides 205. For each of the shutter blades, when moving to a desired position, the associated guide dampers 208 may lock it at the position.

Figure 5:
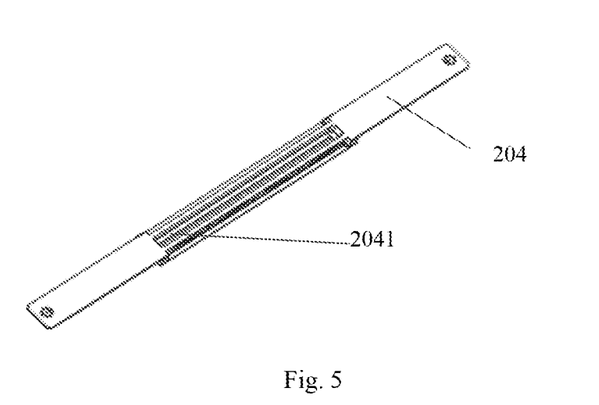
FIG. 5 is a structural schematic of a rear shutter blade.

Preferably, referring to FIG. 5, the rear shutter blade 204 may define a slit 2041 around the center thereof. The slit 2041 extends longitudinally parallel to the scanning direction. Prior to the exposure, the slit may undergo an illuminance test in which the rear shutter blade 204 is moved in the scanning direction, with a sensor (not shown) disposed under the mask stage receiving illumination light that has successively propagated through the slit 2041 and the mask stage.

Preferably, with continued reference to FIG. 4, locators may be provided on the first movement guides 205 for locating the two shutter blades during their movement. In this embodiment, the locators are implemented as grating scales 201.

Figure 7:
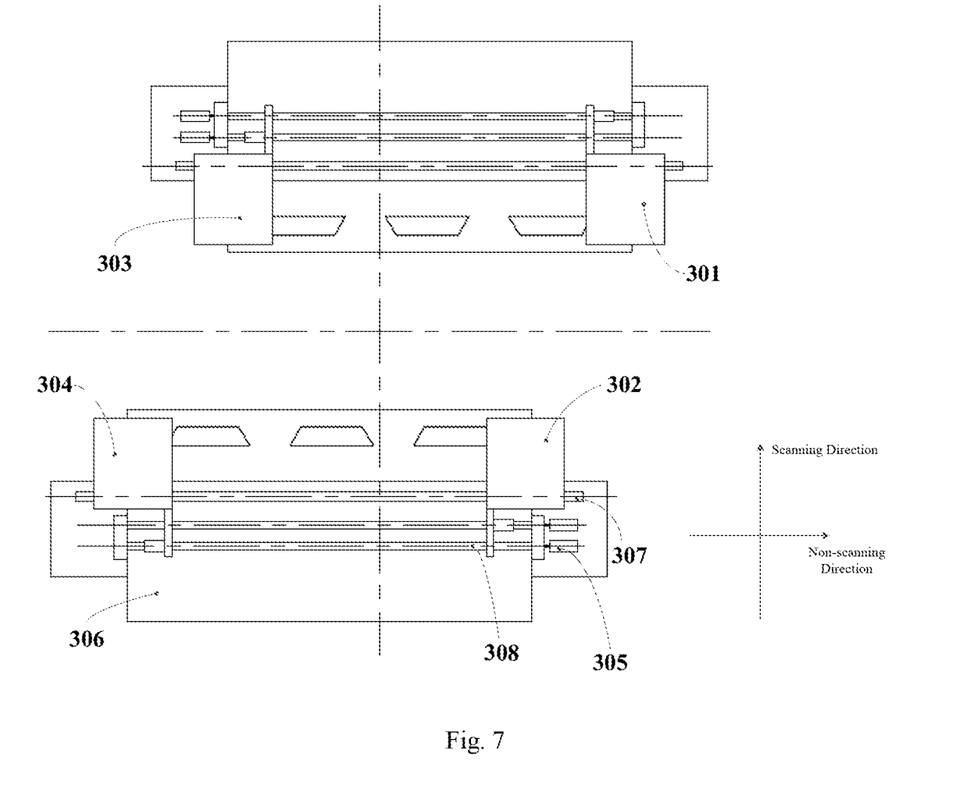
FIG. 7 is a structural schematic of a non-scanning-directional shutter blade subassembly according to the present invention.

Referring to FIG. 7, the non-scanning-directional shutter blade subassembly is disposed under the objective lenses 306 and includes four shutter blades, second movement guides 307 and second driving members. Each of the four shutter blades, i.e., a first shutter blade 301, a second shutter blade 302, a third shutter blade 303 and a fourth shutter blade 304 may be rectangular. The four shutter blades may be evenly distributed on the two second movement guides 307 that extends longitudinally parallel to the non-scanning-direction. Each of the second driving members may include a lead screw 308 extending longitudinally parallel to the second movement guides 307 and a rotating motor 305 coupled to the lead screw 308. The shutter blades may be disposed on the lead screws 308 in one-to-one correspondence. Each of the shutter blades is able to individually move on a corresponding one of the second movement guide 307 under the action of the respective lead screw 308 cooperating with the rotating motor 305 coupled thereto. A stroke of each of the four shutter blades may be measured by an encoder the rotating motor 305. In this embodiment, the two second movement guides 307 may be disposed under the respective rows of objective lens 306 of the objective lens assembly. Each of the second movement guides 307 supports two of the shutter blades, and each of these two shutter blades can be driven to move on the second movement guide 307 by the respective pair of lead screw 308 and rotating motor 305. In this way, the transmission of light beams from each row of objective lenses 306 can be controlled. In other words, the four shutter blades can cooperate to modulate the illumination light so as to obtain a desired light spot in the target region to be exposed.

The present invention also provides an exposure method using the large-FoV photolithography machine as defined above. The method includes the steps as detailed below.

Figure 6:
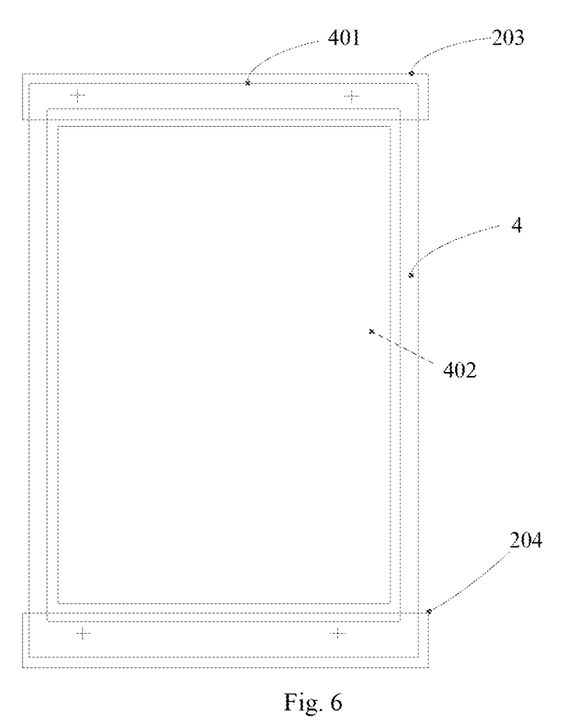
FIG. 6 is a diagram schematically illustrating the positions of shutter blades in a scanning-directional shutter blade subassembly during normal exposure according to the present invention.

In Step 1, the photomask 4 is provided, which has alignment areas 401 and an array of several periodic pattern areas 402. As shown in FIG. 6, the alignment areas 401 are distributed in symmetry in end portions of the photomask 4 and the alignment areas 401 contain alignment marks for aligning the photomask 4 with the substrate during exposure.

Each of the pattern areas 402 corresponds to a print area of the substrate. Each print area of the substrate is exposed with the aid of the corresponding pattern area 402 of the photomask 4 in one exposure cycle. Before each exposure cycle is commenced, the pattern and print areas are both moved into an exposure FoV, where an illuminance test is then conducted to ensure sufficient illuminance at various positions of the substrate for photolithography. This illuminance test involves moving the scanning-directional shutter blade subassembly in the scanning-direction within the exposure FoV. Specifically, referring to FIGS. 4 and 5, with the front shutter blade 203 staying stationary above one of the alignment areas 401, the illumination device is activated and the rear shutter blade 204 is then moved in the scanning direction. Concurrently, a sensor disposed under the mask stage receives the illumination light that has passed through the slit 2041 in the rear shutter blade 204 and the mask stage to obtain illuminance data.

Figure 8:
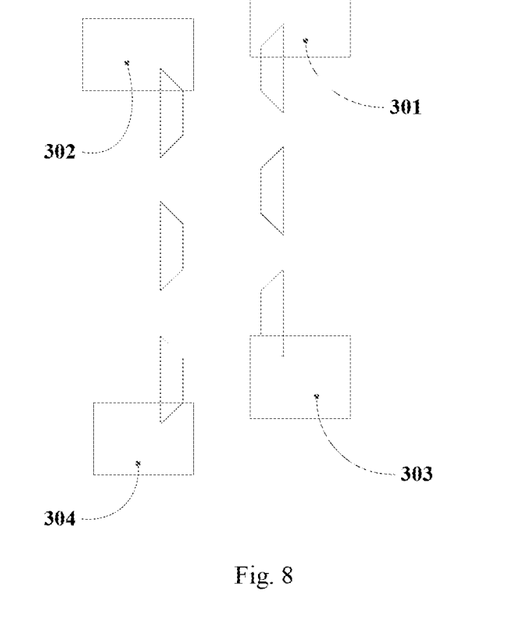
FIG. 8 is a diagram schematically illustrating the positions of shutter blades in the non-scanning-directional shutter blade subassembly during full-FoV exposure according to the present invention.
Figure 9:
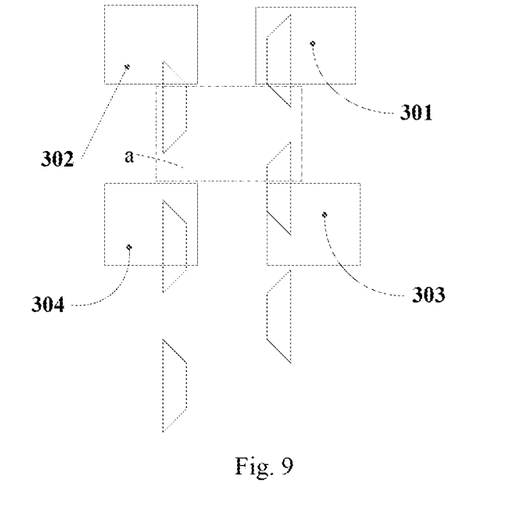
FIG. 9 is a diagram schematically illustrating the positions of the shutter blades in the non-scanning-directional shutter blade subassembly during partial-FoV exposure according to the present invention.

In Step 2: Referring to FIGS. 8 and 9, in case the exposure cycle is full-FoV exposure, the non-scanning-directional shutter blade subassembly does not need to be moved. However, if the exposure cycle is partial-FoV exposure, subsequent to the illuminance test, the rear shutter blade 204 is moved to be positioned above the other alignment area 401 of the photomask 4 and is maintained stationary relative to this alignment area 401 at this position. The non-scanning-directional shutter blade subassembly is then moved into the exposure FoV, and the first, second, third and fourth shutter blades 301, 302, 303 and 304 work together to define a window that modulates the illumination light so that a desired light spot is formed on the print area. After that, the print area is exposed by moving the wafer stage and the mask stage in the same direction and at the same speed and moving the scanning-directional shutter blade subassembly in synchronization with the mask stage, i.e., in the same direction and at the same speed.

In Step 3: the mask and wafer stages are moved in the same direction so that the next print area to be exposed is shifted into the exposure FoV. Steps 1 and 2 are repeated until all the print areas have been exposed.

In the shutter blade assembly for a photolithography machine, the large-FoV photolithography machine and the exposure method provided in the present invention, the scanning-directional shutter blade subassembly is moved once during each illuminance test and moved above the alignment marks after the test. During exposure, the scanning-directional shutter blade subassembly moves with the mask stage in the same direction and at the same speed so that it stays stationary relative to the alignment marks on the photomask 4. In case of full-FoV exposure, it is not necessary for the non-scanning-directional shutter blade subassembly to be moved, while in case of partial-FoV exposure, it is moved into the partial exposure FoV and defines there a window for obtaining a light spot with a desired shape by modulating the illumination light. After that, with the non-scanning-directional shutter blade subassembly being maintained stationary, the exposure FoV can be shifted from the current exposed region to a new region to be exposed simply by moving the mask and wafer stages. This process can be repeated until all the regions to be exposed have been exposed.

Compared to the prior art, the present invention offers the following benefits:

1. It is simpler in structure because exposure tasks in applications with various exposure FoVs can be fulfilled with the same scanning-directional and non-scanning-directional shutter blade subassemblies simply by moving the mask and wafer stages.

2. During exposure, it is not necessary for the scanning-directional and non-scanning-directional shutter blade subassemblies to always move with the mask and wafer stages at various speeds. This can lower the requirements for control accuracy and reduce the probability of error.

It is apparent that those skilled in the art can make various modifications and variations to the present invention without departing from the spirit and scope thereof. Accordingly, the invention is intended to embrace all such modifications and variations if they fall within the scope of the appended claims and equivalents thereof.

What is claimed is:

1. A shutter blade assembly for a photolithography machine, the shutter blade assembly being disposed within the photolithography machine, the photolithography machine being configured to perform an exposure during which a mask stage and a wafer stage move in a same direction that is defined as a scanning direction, with a direction horizontally orthogonal to the scanning direction being defined as a non-scanning direction, wherein the shutter blade assembly comprises:
   a scanning-directional shutter blade subassembly movable in the scanning direction, the scanning-directional shutter blade subassembly being configured to shade alignment marks on a photomask carried by the mask stage; and
   a non-scanning-directional shutter blade subassembly movable in the non-scanning direction,
wherein a light spot of an illumination light provided by an illumination device of the photolithography machine is used for the exposure after having been trimmed by a window defined by the non-scanning-directional shutter blade subassembly,
wherein during the exposure, the scanning-directional shutter blade subassembly stays stationary relative to the alignment marks on the photomask, and the non-scanning-directional shutter blade subassembly stays stationary relative to the illumination device; and
wherein the scanning-directional shutter blade subassembly comprises a front shutter blade and a rear shutter blade extending longitudinally parallel to each other, wherein each of the front and rear shutter blades is a metal sheet extending longitudinally parallel to the non-scanning direction, and wherein the rear shutter blade has a slit extending longitudinally parallel to the non-scanning direction formed therein.

2. A large-field of view (FoV) photolithography machine for exposing multiple regions to be exposed, comprising, disposed sequentially from the top downward:
   an illumination device for providing an illumination light;
   a mask stage for carrying a photomask; and
   a wafer stage for carrying a substrate to be scan-exposed,
      wherein during exposure, the wafer stage and the mask stage move in a same direction and at a same speed, the direction being defined as a scanning direction, with a direction horizontally orthogonal to the scanning direction being defined as a non-scanning direction,
   the large-FoV photolithography machine further comprising:
      a scanning-directional shutter blade subassembly movable in the scanning direction, the scanning-directional shutter blade subassembly being configured to shade alignment marks on the photomask; and
      a non-scanning-directional shutter blade subassembly movable in the non-scanning direction,
   wherein a light spot of the illumination light provided by an illumination device of the photolithography machine is used for the exposure after having been trimmed by a window defined by the non-scanning-directional shutter blade subassembly,
   wherein the exposure of each of the multiple regions to be exposed is performed by keeping the scanning-directional shutter blade subassembly stationary relative to the alignment marks on the photomask and keeping the non-scanning-directional shutter blade subassembly stationary relative to the illumination device, wherein the exposure of the multiple regions to be exposed can be completed by driving the mask stage and the wafer stage to successively move the multiple regions to be exposed into an illumination FoV of the illumination device; and wherein the scanning-directional shutter blade subassembly comprises a front shutter blade and a rear shutter blade extending longitudinally parallel to each other, wherein each of the front and rear shutter blades is a metal sheet extending longitudinally parallel to the non-scanning direction, and wherein the rear shutter blade has a slit extending longitudinally parallel to the non-scanning direction formed therein.

3. The large-FoV photolithography machine of claim 2, wherein the scanning-directional shutter blade subassembly is disposed on a coarse-motion stage for the mask stage and is situated higher than the photomask, the scanning-directional shutter blade moving with the coarse-motion stage for the mask stage during the exposure.

4. The large-FoV photolithography machine of claim 2, wherein a sensor is disposed under the mask stage and configured to sense the illumination light that has passed through the slit.

5. The large-FoV photolithography machine of claim 2, wherein the scanning-directional shutter blade subassembly further comprises a first movement guide and a first driving member, the first movement guide extending longitudinally along the scanning direction, the first driving member being configured to drive the front and rear shutter blades to move along the first movement guide.

6. The large-FoV photolithography machine of claim 5, wherein two first movement guides that are parallel to each other are provided, and wherein two ends of each of the front and rear shutter blades are moveable along the two first movement guides.

7. The large-FoV photolithography machine of claim 6, wherein the first driving member comprises linear motors disposed at the two ends of each of the front and rear shutter blades.

8. The large-FoV photolithography machine of claim 6, wherein decoupling devices are arranged in connections between the two ends of each of the front and rear shutter blades and the first movement guides.

9. The large-FoV photolithography machine of claim 8, wherein the decoupling devices are cross roller rings.

10. The large-FoV photolithography machine of claim 6, wherein blade locking devices are provided at connections between the two ends of each of the front and rear shutter blades and the first movement guides.

11. The large-FoV photolithography machine of claim 10, wherein the blade locking devices are guide dampers configured to immobilize the front and rear shutter blades on the first movement guides.

12. The large-FoV photolithography machine of claim 6, wherein the first movement guides are provided with respective orientation measuring devices.

13. The large-FoV photolithography machine of claim 12, wherein the orientation measuring devices are grating scales.

14. The large-FoV photolithography machine of claim 2, further comprising an objective lens assembly disposed between the mask stage and the substrate, the objective lens assembly comprising several objective lenses arranged in an array.

15. The large-FoV photolithography machine of claim 14, wherein the non-scanning-directional shutter blade subassembly is disposed between the objective lens assembly and the substrate.

16. The large-FoV photolithography machine of claim 2, wherein the non-scanning-directional shutter blade subassembly comprises four shutter blades arranged in two rows and two columns.

17. The large-FoV photolithography machine of claim 16, wherein the shutter blades are rectangular.

18. The large-FoV photolithography machine of claim 16, wherein the non-scanning-directional shutter blade subassembly further comprises a second movement guide and a second driving member, each extending longitudinally in the non-scanning direction, the second driving member being configured to drive the four shutter blades to move along the second movement guide so as to accomplish FoV adjustment.

19. The large-FoV photolithography machine of claim 18, wherein two second movement guides opposing each other are provided, with each of the second movement guides supporting two of the shutter blades, the two of the shutter blades being movable along a corresponding one of the two second movement guides.

20. The large-FoV photolithography machine of claim 18, wherein the second driving member comprises a lead screw extending parallel to the second movement guide and a rotating motor that is coupled to the lead screw, each of the shutter blades of the non-scanning-directional shutter blade subassembly is driven by the rotating motor cooperating with the lead screw.

21. An exposure method using a large-FoV photolithography machine comprising, disposed sequentially from the top downward: an illumination device for providing an illumination light a mask stage for carrying a photomask; and a wafer stage for carrying a substrate to be scan-exposed, wherein during exposure, the wafer stage and the mask stage move in a same direction and at a same speed, the direction being defined as a scanning direction, with a direction horizontally orthogonal to the scanning direction being defined as a non-scanning direction, the large-FoV photolithography machine further comprising: a scanning-directional shutter blade subassembly movable in the scanning direction, the scanning-directional shutter blade subassembly being configured to shade alignment marks on the photomask; and a non-scanning-directional shutter blade subassembly movable in the non-scanning direction, wherein a light spot of the illumination light provided by an illumination device of the photolithography machine is used for the exposure after having been trimmed by a window defined by the non-scanning-directional shutter blade subassembly, wherein the exposure of each of the multiple regions to be exposed is performed by keeping the scanning-directional shutter blade subassembly stationary relative to the alignment marks on the photomask and keeping the non-scanning-directional shutter blade subassembly stationary relative to the illumination device, wherein the exposure of the multiple regions to be exposed can be completed by driving the mask stage and the wafer stage to successively move the multiple regions to be exposed into an illumination FoV of the illumination device, the exposure method of claim 2, comprising the steps of:

1) prior to exposure, performing an illuminance test for a region to be exposed by moving the scanning-directional shutter blade subassembly over the region to be exposed in the scanning direction;

2) moving the non-scanning-directional shutter blade subassembly over the region to be exposed and defining, by the non-scanning-directional shutter blade subassembly, a window for trimming an illumination light;

3) moving the mask stage and the wafer stage in a same direction and moving the scanning-directional shutter blade subassembly with the mask stage so that the scanning-directional shutter blade subassembly is stationary relative to alignment marks on the photomask and the non-scanning-directional shutter blade subassembly is stationary relative to the illumination device, thereby exposing the region to be exposed; and 4) moving a new region to be exposed into an illumination FoV of the illumination device by moving the mask stage and the wafer stage and repeating step 1) to step 3) to expose the new region to be exposed, wherein in step 2), the illuminance test for the region to be exposed performed by moving the scanning-directional shutter blade subassembly over the region to be exposed in the scanning direction comprises: fixing the front shutter blade above the alignment areas, while moving the rear shutter blade in the scanning direction and receiving, by a sensor disposed under the mask stage, the illumination light that has successively passed through a slit in the rear shutter blade and the mask stage; and deriving illuminance data for the region to be exposed from the received illumination light.

22. The exposure method of claim 21, wherein the photomask comprises two alignment areas distributed in symmetry and several pattern areas arranged in an array, the two alignment areas distributed at respective ends of the photomask, each of the pattern areas corresponding to a region to be exposure.

23. The exposure method of claim 22, wherein the scanning-directional shutter blade subassembly comprises a front shutter blade and a rear shutter blade, and wherein during exposure, the front and rear shutter blades are positioned above the respective alignment areas to block the illumination light away from the alignment areas.

* * * * *